United States Patent
Kidoh

(10) Patent No.: US 6,906,602 B2
(45) Date of Patent: Jun. 14, 2005

(54) SURFACE ACOUSTIC WAVE FILTER UTILIZING TWO PARALLEL ACOUSTIC CHANNELS WITH ONE HAVING A NARROWER BANDWIDTH

(75) Inventor: Hideo Kidoh, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 40 days.

(21) Appl. No.: 10/715,570

(22) Filed: Nov. 19, 2003

(65) Prior Publication Data

US 2004/0135653 A1 Jul. 15, 2004

(30) Foreign Application Priority Data

Jan. 9, 2003 (JP) .......................................... 2003-003517
Sep. 26, 2003 (JP) .......................................... 2003-335628

(51) Int. Cl.[7] .............................................. H03H 9/64
(52) U.S. Cl. ...................................... 333/193; 310/313 B
(58) Field of Search ................................. 333/193–196; 310/313 B, 313 D

(56) References Cited

U.S. PATENT DOCUMENTS 6,313,717 B1 * 11/2001 Dufilie et al. .................. 333/193
6,462,633 B1 * 10/2002 Ichikawa ...................... 333/193
6,476,691 B1 * 11/2002 Tsuzuki et al. ................ 333/193
6,650,206 B2 * 11/2003 Nakamura et al. ............ 333/193

FOREIGN PATENT DOCUMENTS

| DE | 197 26 594 A1 | * | 1/1999 | ............ H03H/9/64 |
| EP | 1 104 100 A1 | | 5/2001 | |
| EP | 1 189 346 A2 | | 3/2002 | |
| JP | 2000-077974 | | 3/2000 | |
| JP | 2001-053581 | | 2/2001 | |

* cited by examiner

Primary Examiner—Barbara Summons
(74) Attorney, Agent, or Firm—Keating & Bennett, LLP

(57) ABSTRACT

A surface acoustic wave filter includes a first acoustic channel which has first input/output transducers and which is configured so as to define a first transfer function by the first input/output transducers, and a second acoustic channel which has second input/output transducers and which is configured so as to define a second transfer function by the second input/output transducers. The first and second acoustic channels are electrically connected in parallel. The first and second transfer functions are substantially in phase within a pass band, while they have substantially opposite phases outside the pass band. The bandwidth of the second acoustic channel is narrower than that of the first acoustic channel. A first side lobe of the second transfer function has a phase opposite to that of a main lobe of the first acoustic channel.

9 Claims, 5 Drawing Sheets

SURFACE ACOUSTIC WAVE FILTER UTILIZING TWO PARALLEL ACOUSTIC CHANNELS WITH ONE HAVING A NARROWER BANDWIDTH

BACKGROUND OF THE INVENTION

1. Field of the Invention

The present invention relates to surface acoustic wave (SAW) filters used as, for example, band-pass filters. More specifically, the present invention relates to a dual-track SAW filter including first and second acoustic channels.

2. Description of the Related Art

Various types of dual-track SAW devices including two acoustic channels have been proposed. For example, Patent Document 1: Japanese Unexamined Patent Application Publication No. 2000-77974 discloses a SAW filter including two acoustic channels which are connected in parallel. The two acoustic channels are in phase within a pass band, while they have opposite phases outside the pass band.

Also, Patent Document 2: Japanese Unexamined Patent Application Publication No. 2001-53581 discloses a SAW filter in which first and second filter tracks, defining first and second channels, are arranged on a piezoelectric substrate in parallel. In this SAW filter, an input IDT electrode of the first filter track is electrically connected in parallel with an input IDT electrode of the second filter track, and an output IDT electrode of the first filter track is electrically connected in parallel with an output IDT electrode of the second filter track. The first and second filter tracks are in phase within a pass band, while they have opposite phases outside the pass band. Furthermore, in the SAW filter according to Patent Document 2, frequencies of transmission functions (maximum value—3 dB), that is, 3 dB center frequencies of the first and second filter tracks substantially match with each other.

More specifically, the SAW filter disclosed in Patent Document 1 is used as an IF filter for PCS. In PCS, the ratio between a 30 dB bandwidth and a 3 dB bandwidth, that is, the shape factor (S.F.), is preferably about 1.8 at the maximum. On the other hand, IF filters for a W-CDMA scheme or digital satellite radio are required to have an S.F. of about 1.5 or less. That is, a curve at the vicinity of the pass band in the filter characteristic is steeper.

When the dual-track SAW filter described in Patent Document 1 is used where a steeper filter characteristic is required, a region where the first and second acoustic channels have opposite phases and the same amplitude must be ensured over a wide range of frequencies. However, when an attempt is made to realize the region of opposite phases and the same amplitude over a wide range of frequencies by main lobes of the first and second acoustic channels, the phases cannot be canceled out over a sufficiently wide range of frequencies, because inclinations of the phases of the two acoustic channels are different. That is, a large response remains outside the pass band.

In the SAW filter described in Patent Document 2, steepness of the filter characteristic of the entire filter is determined by steepness of the filter characteristic of one of the filter tracks. Also, the first and second filter tracks have opposite phases outside the pass band in order to increase attenuation outside the pass band, as in Patent Document 1. Therefore, the steepness of the filter characteristic cannot be increased to so as to be steeper than one of the filter tracks.

SUMMARY OF THE INVENTION

To overcome the problems described above, preferred embodiments of the present invention provide a dual-track SAW filter in which steepness of the filter characteristic is increased and out-of-band response is effectively suppressed.

A surface acoustic wave filter according to a preferred embodiment of the present invention includes a first acoustic channel having a first input transducer and a first output transducer, the first acoustic channel being weighted so as to define a first transfer function by the first input transducer and the first output transducer, and a second acoustic channel having a second input transducer and a second output transducer, the second acoustic channel being weighted so as to define a second transfer function by the second input transducer and the second output transducer. The first and second input transducers are electrically connected in parallel and the first and second output transducers are electrically connected in parallel. The first and second transfer functions are substantially in phase within a pass band and have substantially opposite phases outside the pass band. The bandwidth of the second transfer function of the second acoustic channel is narrower than that of the first transfer function of the first acoustic channel, and a first side lobe of the second transfer function of the second acoustic channel has a phase opposite to that of a main lobe of the first transfer function of the first acoustic channel.

Preferably, the ratio of a 30 dB bandwidth of the first transfer function of the first acoustic channel to a 30 dB bandwidth of a composite transfer function obtained by connecting the first and second acoustic channels in parallel is in the range of about 100% to about 150%. The 30 dB bandwidth is a frequency range in which the value of attenuation from the peak is 30 dB.

Each of the first and second acoustic channels preferably includes a transversal surface acoustic wave filter device.

Each of the first and second acoustic channels preferably includes a unidirectional electrode.

The first and second acoustic channels are preferably provided on a piezoelectric substrate.

The dual-track SAW filter according to another preferred embodiment of the present invention includes the first and second acoustic channels. The input transducers and the output transducers of the first and second acoustic channels are electrically connected in parallel, the first and second transfer functions are substantially in phase within the pass band, and have substantially opposite phases outside the pass band. The bandwidth of the second acoustic channel is narrower than that of the first acoustic channel, and the first side lobe of the second transfer function of the second acoustic channel has a phase opposite to that of the main lobe of the first transfer function of the first acoustic channel. With this configuration, a region where the first and second transfer functions have opposite phases and the same amplitude is obtained over a wide range of frequencies outside the pass band. Accordingly, steepness of the filter characteristic and attenuation outside the pass band is increased as compared to known dual-track SAW filters.

When the ratio of the 30 dB bandwidth of the first transfer function of the first acoustic channel to the 30 dB bandwidth of the composite transfer function of the first and second transfer functions is preferably in the range of about 100% to about 150%, steepness of the filter characteristic and attenuation outside the pass band is increased more reliably according to preferred embodiments of the present invention.

Each of the first and second acoustic channels may include various types of SAW filter devices. When each acoustic channel includes a transversal SAW filter device, a transversal dual-track SAW filter according to preferred embodiments of the present invention is obtained.

When each of the first and second acoustic channels includes a unidirectional electrode, a low-loss dual-track filter is obtained.

By providing the first and second acoustic channels on a piezoelectric substrate, the SAW filter of preferred embodiments of the present invention can be configured in a form of a single chip including a piezoelectric substrate.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

Hereinafter, preferred embodiments of the present invention will be described with reference to the drawings.

Figure 1:
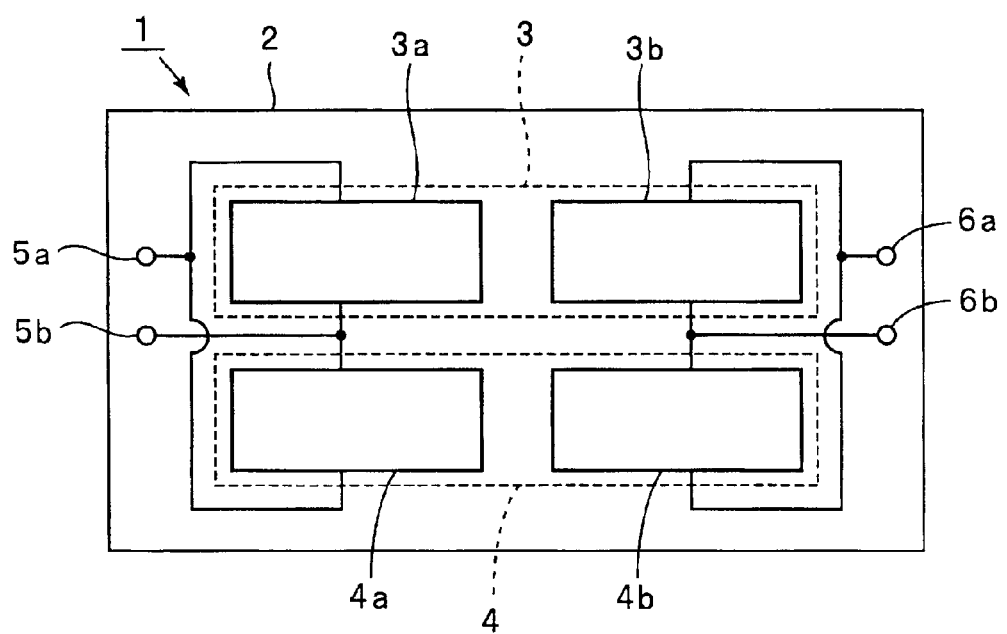
FIG. 1 is a schematic plan view showing an SAW filter according to a preferred embodiment of the present invention.

FIG. 1 is a schematic plan view showing a dual-track surface acoustic wave (SAW) filter according to a preferred embodiment of the present invention.

A SAW filter 1 preferably includes a piezoelectric substrate 2, and first and second acoustic channels 3 and 4 are provided thereon. In the present preferred embodiment, the bandwidth of a first transfer function of the first acoustic channel 3 is wider than that of a second transfer function of the second acoustic channel 4. That is, the first acoustic channel 3 defines a main track and the second acoustic channel 4 defines a sub-track.

The first acoustic channel 3 includes a first input transducer 3a and a first output transducer 3b, which are provided on the piezoelectric substrate 2. Each of the first input transducer 3a and the first output transducer 3b includes an IDT electrode, and these transducers are arranged with a desired distance therebetween in the propagation direction of surface acoustic waves. That is, the first acoustic channel 3 includes a transversal SAW filter device.

Likewise, the second acoustic channel 4 includes a second input transducer 4a and a second output transducer 4b. Each of the second input transducer 4a and the second output transducer 4b includes an IDT electrode, and these transducers are arranged with a desired distance therebetween in the propagation direction of surface acoustic waves. That is, the second acoustic channel 4 includes a transversal SAW filter device, similar to the first acoustic channel 3.

The first input transducer 3a and the second input transducer 4a are electrically connected in parallel. That is, hot terminals of the first and second input transducers 3a and 4a are connected to a hot input terminal 5a, and ground terminals of the first and second input transducers 3a and 4a are connected to a ground input terminal 5b.

Also, the first output transducer 3b and the second output transducer 4b are electrically connected in parallel. That is, hot terminals of the first and second output transducers 3b and 4b are connected to a hot output terminal 6a, and ground terminals of the first and second output transducers 3b and 4b are connected to a ground output terminal 6b.

The first acoustic channel 3 is weighted so as to define the first transfer function by the first input transducer 3a and the first output transducer 3b. Likewise, the second acoustic channel 4 is weighted so as to define the second transfer function by the second input transducer 4a and the second output transducer 4b.

In the present preferred embodiment, the ratio of a 30 dB bandwidth of the first transfer function to a 30 dB bandwidth of a composite transfer function of the first and second transfer functions is preferably about 120%.

The first and second transfer functions are substantially in phase within a pass band, and have substantially opposite phases outside the pass band.

Accordingly, as in the SAW filter of the known art described in Patent Document 1, the first and second transfer functions have substantially opposite phases outside the pass band, and thus, the opposite phases cancel each other out such that attenuation is provided.

However, when the phases are canceled out by main lobes, attenuation is provided within only a small range of frequencies. The reason for this is as follows. That is, the phases of the first and second acoustic channels 3 and 4, which are in phase at the vicinity of the center frequency, have to be changed such that they are opposite at the ends of the pass band. Since the phase inclination of the first acoustic channel 3 is different from that of the second acoustic channel 4, the region where the both phases are completely opposite is limited to a very narrow frequency range.

In the present preferred embodiment, the bandwidth of the second acoustic channel 4 is narrower than that of the first acoustic channel 3 and the phase of a first side lobe of the second transfer function of the second acoustic channel 4 is opposite to that of the first acoustic channel 3, such that the phases cancel each other out over a much wider range of frequencies. This will be described with reference to FIG. 2.

Figure 2:
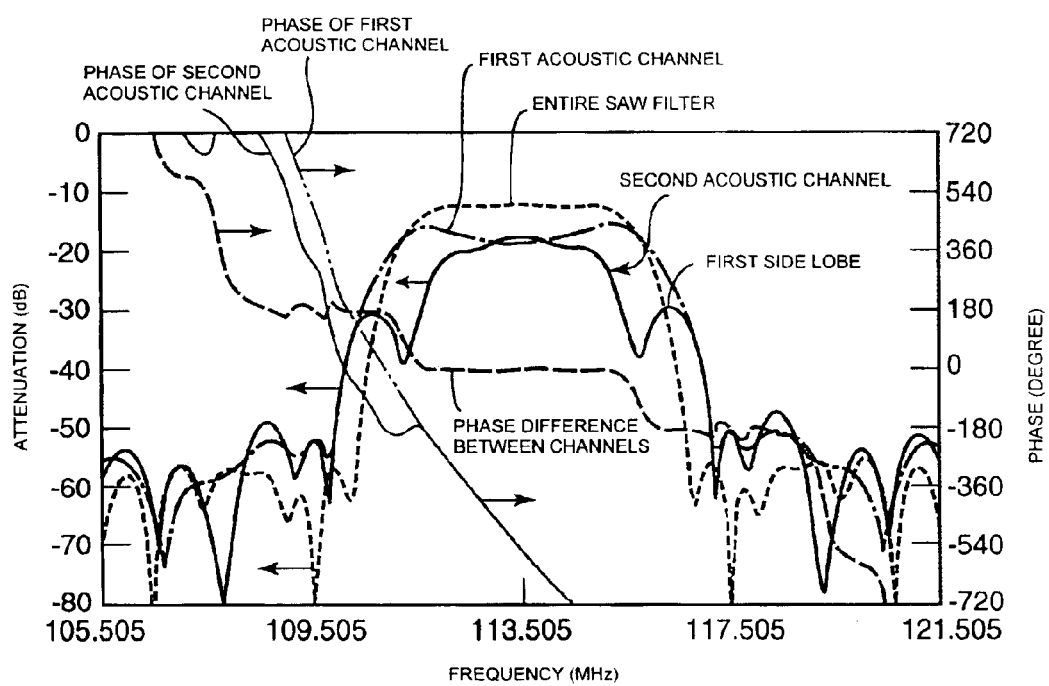
FIG. 2 shows amplitude and phase characteristics of first and second acoustic channels and a composite transfer function in the SAW filter of the preferred embodiment of FIG. 1.

FIG. 2 illustrates the principle of the SAW filter 1 of the preferred embodiments and also illustrates amplitude and phase characteristics of the first and second acoustic channels 3 and 4. As shown in FIG. 2, the bandwidth of the second acoustic channel 4 is narrower than that of the first acoustic channel 3. Furthermore, the first side lobe of the second transfer function of the second acoustic channel 4 has a phase that is opposite to that of the main lobe of the first transfer function of the first acoustic channel 3. That is, the main lobe of the first transfer function of the first acoustic channel 3, which defines a main track, and the first side lobe of the second function of the second acoustic channel 4, which defines a sub-track, cancel the phases. That is, the phase of the second acoustic channel 4, which defines a sub-track, is abruptly inverted at a first attenuation region outside the main lobe of the second acoustic channel 4, and the same inclination of phase is maintained outside thereof. Therefore, the first and second acoustic channels 3 and 4 have substantially opposite phases over the entire first side lobe of the second acoustic channel 4.

Accordingly, in the present preferred embodiment, steepness of the filter characteristic is greatly increased, and at the same time, attenuation outside the pass band is greatly improved.

Furthermore, since the phase of the second acoustic channel 4, which defines a sub-track, is abruptly inverted, a frequency range in which the both channels 3 and 4 are in phase is increased within the pass band. As a result, flatness of the filter characteristic within the pass band is greatly improved.

When the bandwidth of the first acoustic channel 3, which is a main track, is too wide, an increase in the steepness of the filter characteristic and an increase in attenuation outside the pass band cannot be easily achieved at the same time. In the present preferred embodiment, the ratio of the 30 dB bandwidth of the first transfer function to a frequency band in which attenuation from an aimed characteristic peak is 30 dB, that is, a 30 dB bandwidth, is about 120%. With this arrangement, steepness of the filter characteristic and attenuation outside the pass band are increased at the same time.

The configuration of the SAW filter is not limited to the above-described preferred embodiment. The steepness of the filter characteristic and attenuation outside the pass band can be increased at the same time when the ratio of the 30 dB bandwidth of the first acoustic channel 3, which is a main track, to the 30 dB bandwidth of the composite transfer function obtained by connecting the first and second acoustic channels 3 and 4 in parallel is in the range of about 100% to about 150%. This will be described with reference to FIGS. 3 to 5.

Figure 3:
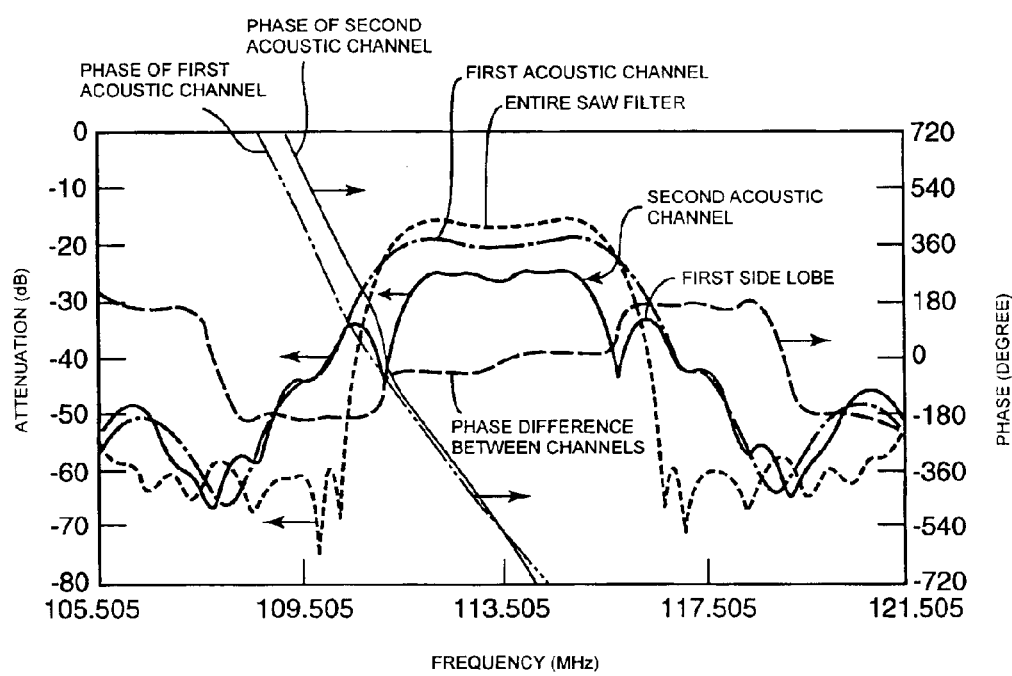
FIG. 3 shows amplitude and phase characteristics of the first and second acoustic channels and the composite transfer function in which the ratio of a 30 dB bandwidth of the first acoustic channel to a 30 dB bandwidth of the composite transfer function is about 150%.

FIG. 3 shows the amplitude and phase characteristics of the composite transfer function and the first and second acoustic channels of the SAW filter 1 in which the ratio of the 30 dB bandwidth of the first transfer function of the main track to the 30 dB bandwidth of the composite transfer function is preferably about 150%.

Figure 4:
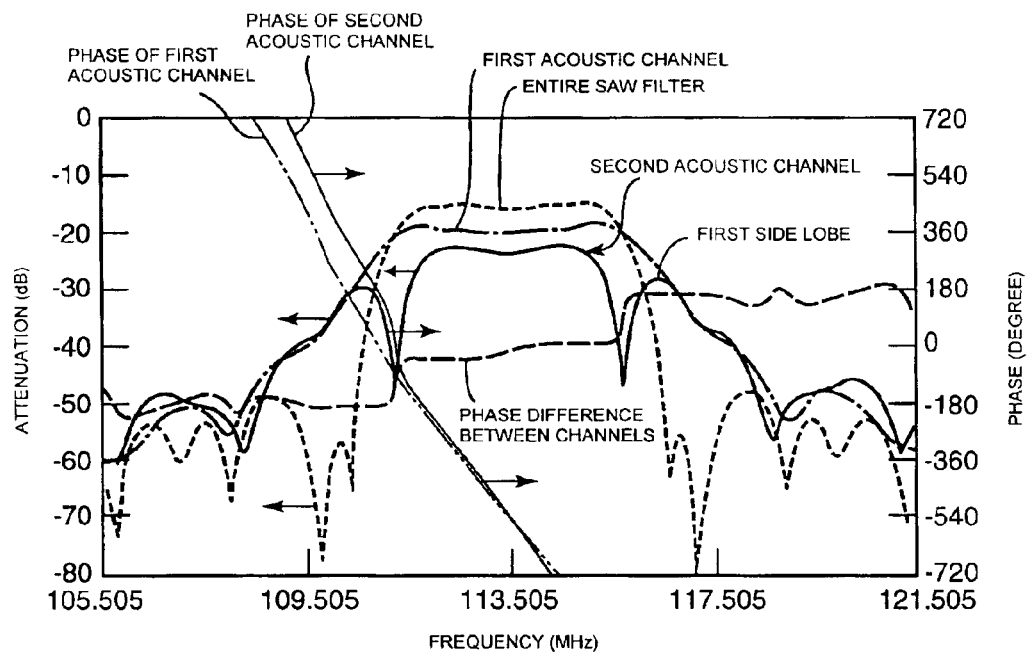
FIG. 4 shows amplitude and phase characteristics of the first and second acoustic channels and the composite transfer function in which the ratio of the 30 dB bandwidth of the first acoustic channel to the 30 dB bandwidth of the composite transfer function is about 180%.

Also, FIG. 4 shows the amplitude and phase characteristics of the composite transfer function and the first and second acoustic channels of the SAW filter 1 in which the ratio of the 30 dB bandwidth of the first transfer function of the main track to the 30 dB bandwidth of the composite transfer function is preferably about 180%.

Figure 5:
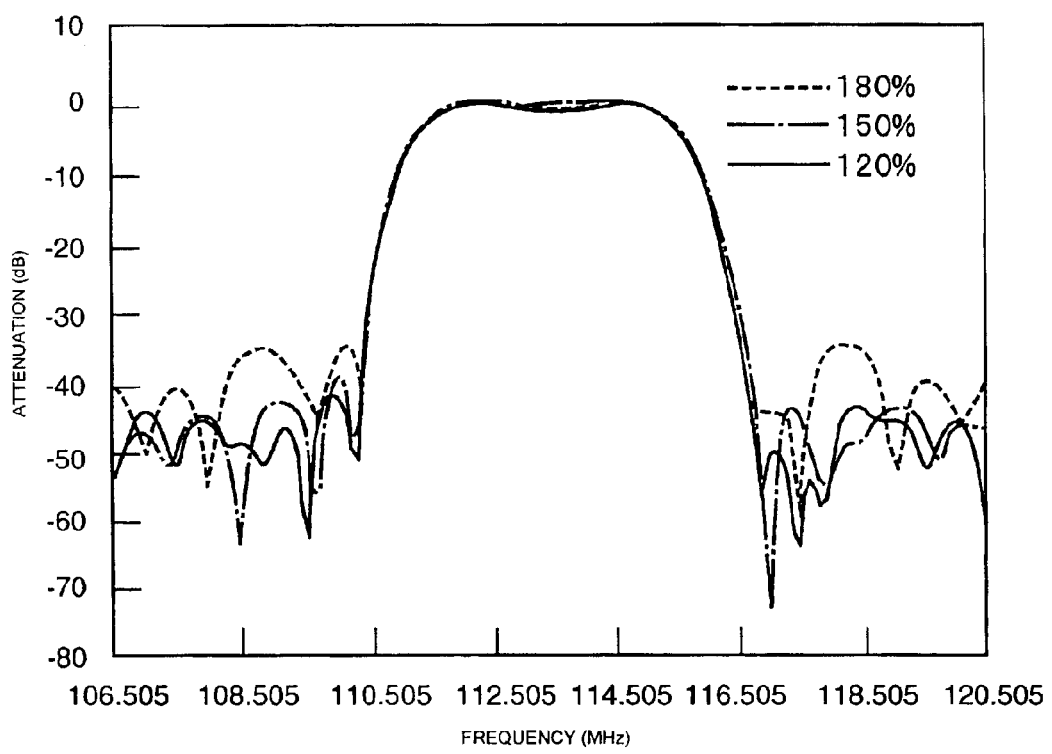
FIG. 5 shows attenuation/frequency characteristics of the entire SAW filter in which the ratio of the 30 dB bandwidth of the first acoustic channel is about 120%, about 150%, and about 180%.

FIG. 5 shows attenuation/frequency characteristics of the entire SAW filter 1 in which the ratio of the 30 dB bandwidth of the first transfer function to the 30 dB bandwidth of the composite transfer function is preferably about 120%, about 150%, and about 180%.

As is clear from FIGS. 3 to 5, when the ratio is about 120% or about 150%, steepness of the filter characteristic and attenuation outside the pass band is increased. On the other hand, when the ratio is about 180%, the attenuation outside the pass band is about 35 dB, which is not sufficient. When the ratio is increased to about 180%, it is difficult to design the second acoustic channel 4, which is a sub-track, so as to satisfy conditions of same amplitude and opposite phases over a wide range of frequencies.

The ratio of the 30 dB bandwidth of the first acoustic channel 3, which is a main track, to the 30 dB bandwidth of the composite transfer function cannot be under about 100%, and thus, the lower limit of the ratio is about 100%.

The first and second input transducers 3a and 4a and the first and second output transducers 3b and 4b of the first and second acoustic channels 3 and 4 include IDT electrodes which are weighted so as to have the first and second transfer functions. Preferably, each transducer includes a unidirectional electrode, as in the above-described Patent Document 1.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A surface acoustic wave filter comprising:
    a first acoustic channel including a first input transducer and a first output transducer, the first acoustic channel being weighted so as to define a first transfer function by the first input transducer and the first output transducer; and
    a second acoustic channel including a second input transducer and a second output transducer, the second acoustic channel being weighted so as to define a second transfer function by the second input transducer and the second output transducer; wherein
    the first and second input transducers are electrically connected in parallel and the first and second output transducers are electrically connected in parallel;
    the first and second transfer functions are substantially in phase within a pass band and have substantially opposite phases outside the pass band; and
    the bandwidth of the second acoustic channel is narrower than that of the first acoustic channel, and a first side lobe of the second transfer function of the second acoustic channel has a phase opposite to that of a main lobe of the first transfer function of the first acoustic channel.

2. A surface acoustic wave filter according to claim 1, wherein the ratio of a 30 dB bandwidth of the first transfer function of the first acoustic channel to a 30 dB bandwidth of a composite transfer function obtained by connecting the first and second acoustic channels in parallel is in the range of about 100% to about 150%.

3. A surface acoustic wave filter according to claim 1, wherein each of the first and second acoustic channels includes a transversal surface acoustic wave filter device.

4. A surface acoustic wave filter according to claim 1, wherein each of the first and second acoustic channels includes a unidirectional electrode.

5. A surface acoustic wave filter according to claim 1, wherein the first and second acoustic channels are provided on a piezoelectric substrate.

6. A surface acoustic wave filter according to claim 1, wherein the ratio of a 30 dB bandwidth of the first transfer function of the first acoustic channel to a 30 dB bandwidth of a composite transfer function obtained by connecting the first and second acoustic channels in parallel is about 120%.

7. A surface acoustic wave filter according to claim 1, wherein the first acoustic channel defines a main track, and the second acoustic channel defines a sub-track.

8. A surface acoustic wave filter according to claim 1, wherein the each of the first input transducer and first output transducer includes an IDT electrode arranged with a distance therebetween in a propagation direction of surface acoustic wave devices.

9. A surface acoustic wave filter according to claim 1, wherein the each of the second input transducer and second output transducer includes an IDT electrode arranged with a distance therebetween in a propagation direction of surface acoustic wave devices.

* * * * *